United States Patent
Choi

(10) Patent No.: US 8,797,812 B2
(45) Date of Patent: Aug. 5, 2014

(54) MEMORY SYSTEM HAVING DELAY-LOCKED-LOOP CIRCUIT

(71) Applicant: Jung-Hwan Choi, Hwaseong-si (KR)

(72) Inventor: Jung-Hwan Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/185,412

(22) Filed: Feb. 20, 2014

(65) Prior Publication Data

US 2014/0169119 A1    Jun. 19, 2014

Related U.S. Application Data

(63) Continuation of application No. 13/729,412, filed on Dec. 28, 2012, now Pat. No. 8,675,428, and a continuation of application No. 12/979,814, filed on Dec. 28, 2010, now Pat. No. 8,358,547.

(30) Foreign Application Priority Data

Jan. 5, 2010    (KR) .................. 10-2010-0000603

(51) Int. Cl.
| | |
|---|---|
| *G11C 8/00* | (2006.01) |
| *G11C 7/22* | (2006.01) |
| *G11C 11/4076* | (2006.01) |
| *G11C 7/10* | (2006.01) |

(52) U.S. Cl.
CPC .. *G11C 8/00* (2013.01); *G11C 7/22* (2013.01); *G11C 7/222* (2013.01); *G11C 11/4076* (2013.01); *G11C 7/1051* (2013.01); *G11C 7/1066* (2013.01)
USPC ............. 365/194; 365/76; 365/93; 365/233.1

(58) Field of Classification Search
CPC ...... G11C 7/22; G11C 7/222; G11C 11/4076; G11C 7/1051; G11C 7/1066
USPC ................... 365/76, 93, 194, 233.1
See application file for complete search history.

(56) References Cited

U.S. PATENT DOCUMENTS

2004/0179419 A1 * 9/2004 Choi ........................... 365/233

FOREIGN PATENT DOCUMENTS

| | | |
|---|---|---|
| JP | 2002-344310 A | 11/2002 |
| KR | 10-2002-0012710 A | 2/2002 |
| KR | 10-2008-0018691 A | 2/2008 |

* cited by examiner

*Primary Examiner* — Jason Lappas
(74) *Attorney, Agent, or Firm* — Lee & Morse, P.C.

(57) ABSTRACT

A delay-locked-loop (DLL) circuit having a DLL that operates when an external clock signal has a low frequency and a DLL that operates when an external clock signal has a high frequency is disclosed. The DLL circuit includes a first DLL and second DLL. The first DLL adjusts a delay time of an external clock signal to generate a first internal clock signal synchronized with the external clock signal when the external clock signal has a low frequency. The second DLL adjusts the delay time of the external clock signal to generate a second internal clock signal synchronized with the external clock signal when the external clock signal has a high frequency.

3 Claims, 10 Drawing Sheets

MEMORY SYSTEM HAVING DELAY-LOCKED-LOOP CIRCUIT

CROSS REFERENCE TO RELATED APPLICATIONS

This is a continuation application based on pending application Ser. No. 13/729,412, filed Dec. 28, 2012, which in turn is a continuation of application Ser. No. 12/979,814, filed Dec. 28, 2010, now U.S. Pat. No. 8,358,547 B2, the entire contents of which is hereby incorporated by reference.

BACKGROUND

1. Field

Embodiments relate to a semiconductor device, and more particularly, to a semiconductor device and a memory system having a delay-locked-loop circuit.

2. Description of the Related Art

A delay-locked-loop (DLL) circuit is a circuit that generates an internal clock signal synchronized with an external clock signal through a synchronizing process based on a delay amount of a signal.

Semiconductor memory devices such as dynamic random access memories (DRAMs) are used for storing data in computers and electronic products. Data is written to a DRAM device during a write operation mode, and is read from the DRAM during a read operation mode. The output circuit of the DRAM device needs a clock signal such as a data strobe (DS) signal when data is read from the DRAM device. An internal clock signal synchronized with an external clock signal is needed to output the data exactly. Recently, in semiconductor memory devices such as DRAM devices, a clock signal used in the semiconductor memory device is synchronized with the output clock signal by a DLL circuit.

SUMMARY

It is a feature of an embodiment to provide a delay-locked-loop (DLL) circuit that stores locking information of an external clock signal having a low frequency and locking information of an external clock signal having a high frequency beforehand, and generates an internal clock signal synchronized with the external clock signal using the locking information during a subsequent operation.

It is a separate feature of an embodiment to provide a DLL circuit in which a time required to synchronize the internal clock signal with the external clock signal may be relatively short when the external clock signal changes from low frequency to high frequency or from high frequency to low frequency.

It is a separate feature of an embodiment to provide a semiconductor device and/or a system including the DLL circuit that may operate at a relatively higher speed relative to comparable conventional devices.

It is a separate feature of an embodiment to provide a semiconductor device including a DLL circuit that stores locking information of an external clock signal having a low frequency and locking information of an external clock signal having a high frequency beforehand, and generates an internal clock signal synchronized with the external clock signal using the locking information in a later operation.

It is a separate feature of an embodiment to provide a memory system including a DLL circuit that stores locking information of an external clock signal having a low frequency and locking information of an external clock signal having a high frequency beforehand, and generates an internal clock signal synchronized with the external clock signal using the locking information during a subsequent operation.

At least one of the above and other features and advantages may be realized by providing In accordance with an aspect of the inventive concept, a DLL circuit includes a first DLL and a second DLL. The first DLL adjusts a delay time of an external clock signal to generate a first internal clock signal synchronized with the external clock signal when the external clock signal has a low frequency. The second DLL adjusts the delay time of the external clock signal to generate a second internal clock signal synchronized with the external clock signal when the external clock signal has a high frequency.

In an embodiment, the first DLL may store locking information of the first internal clock signal having a low frequency and the second DLL may store locking information of the second internal clock signal having a high frequency. In a subsequent operation, the DLL circuit may generate an internal clock signal synchronized with the external clock signal using the locking information of the first internal clock signal and the locking information of the second internal clock signal.

In an embodiment, the first DLL and the second DLL may operate in response to a mode register set signal.

In an embodiment, the locking information of the first internal clock signal may be a delay amount of a delay line of the first DLL, and the locking information of the second internal clock signal may be a delay amount of a delay line of the second DLL.

In an embodiment, the DLL circuit may further include a selecting circuit that selects one of the first internal clock signal and the second internal clock signal to generate an internal clock signal.

In an embodiment, the first DLL may include a phase detector, a delay control circuit and a delay line.

The phase detector may compare the external clock signal and a feedback signal to generate an up signal and a down signal. The delay control circuit may store locking information for a clock signal having the low frequency, and generate delay control signals based on the up signal and the down signal. The delay line may delay the external clock signal to generate the first internal clock signal in response to the delay control signals.

In an embodiment, the delay control circuit may operate when the external clock signal has a low frequency, and may not operate when the external clock signal has a high frequency.

In an embodiment, the first DLL may further include a replica path that delays the first internal clock signal to generate the feedback clock signal.

In an embodiment, the second DLL may include a phase detector, a delay control circuit and a delay line.

The phase detector may compare the external clock signal and a feedback signal to generate an up signal and a down signal. The delay control circuit may store locking information for a clock signal having the high frequency, and generate delay control signals based on the up signal and the down signal. The delay line may delay the external clock signal to generate the second internal clock signal in response to the delay control signals.

In an embodiment, the delay control circuit may operate when the external clock signal has a high frequency, and may not operate when the external clock signal has a low frequency.

In accordance with another aspect of the inventive concept, a DLL circuit includes a first DLL and a second DLL. The first DLL adjusts a delay time of a first external clock signal having a low frequency received from a first input terminal to generate a first internal clock signal synchronized with the first external clock signal. The second DLL adjusts a delay time of a second external clock signal having a high frequency received from a second input terminal to generate a second internal clock signal synchronized with the second external clock signal.

In accordance with still another aspect of the inventive concept, a semiconductor device includes a DLL circuit and an internal circuit. The DLL circuit generates an internal clock signal synchronized with an external clock signal and the internal circuit operates in response to the internal clock signal. The DLL circuit includes a first DLL and a second DLL. The first DLL adjusts a delay time of an external clock signal to generate a first internal clock signal synchronized with the external clock signal when the external clock signal has a low frequency. The second DLL adjusts the delay time of the external clock signal to generate a second internal clock signal synchronized with the external clock signal when the external clock signal has a high frequency.

In an embodiment, the semiconductor device may be a semiconductor memory device.

In an embodiment, the internal circuit may be an output circuit of the semiconductor memory device.

In accordance with yet another aspect of the inventive concept, a memory system includes a memory controller and a semiconductor memory device which transmits to or receives from the memory controller. The semiconductor memory device includes a DLL circuit for generating an internal clock signal synchronized with an external clock signal, and an internal circuit operating in response to the internal clock signal. The DLL circuit includes a first DLL and a second DLL. The first DLL adjusts a delay time of an external clock signal to generate a first internal clock signal synchronized with the external clock signal when the external clock signal has a low frequency. The second DLL adjusts the delay time of the external clock signal to generate a second internal clock signal synchronized with the external clock signal when the external clock signal has a high frequency.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0000603, filed on Jan. 5, 2010, in the Korean Intellectual Property Office, and entitled: "Delay-Locked-Loop Circuit, Semiconductor Device and Memory System Having the Delay-Locked-Loop Circuit," is incorporated by reference herein in its entirety.

Various exemplary embodiments will now be described more fully with reference to the accompanying drawings in which some embodiments are shown. The features described may, however, be embodied in different forms and should not be construed as limited to the embodiments set forth herein. Rather, these embodiments are provided so that this disclosure is thorough and complete and fully conveys the inventive concept to those skilled in the art.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
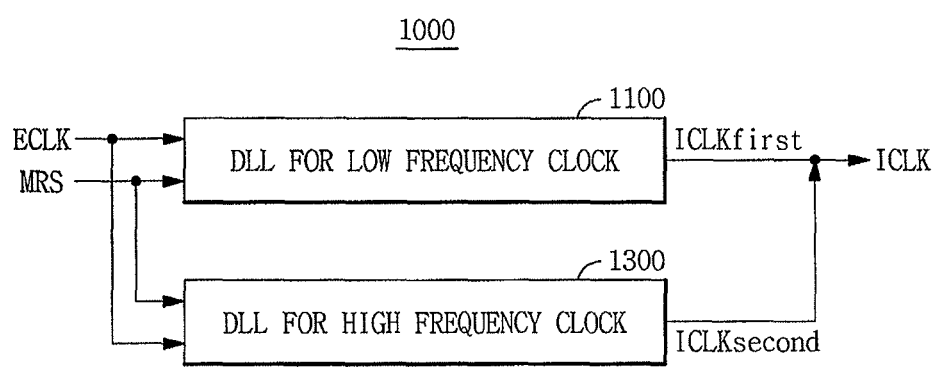
FIG. 1 illustrates a block diagram of an exemplary embodiment of a delay-locked-loop (DLL) circuit.

FIG. 1 illustrates a block diagram of an exemplary embodiment of a delay-locked-loop (DLL) circuit 1000. Referring to FIG. 1, the DLL circuit 1000 may include a first DLL 1100 and a second DLL 1300.

The first DLL 1100 may adjust a delay time of an external clock signal ECLK to generate a first internal clock signal $ICLK_{first}$ synchronized with the external clock signal ECLK when the external clock signal ECLK has a low frequency.

The second DLL 1300 may adjust the delay time of the external clock signal ECLK to generate a second internal clock signal ICLK$_{second}$ synchronized with the external clock signal ECLK when the external clock signal ECLK has a high frequency. The DLL circuit 1000 may output the first internal clock signal ICLK$_{first}$ or the second internal clock signal ICLK$_{second}$ as an internal clock signal ICLK in response to a mode register set (MRS) signal.

Figure 2:
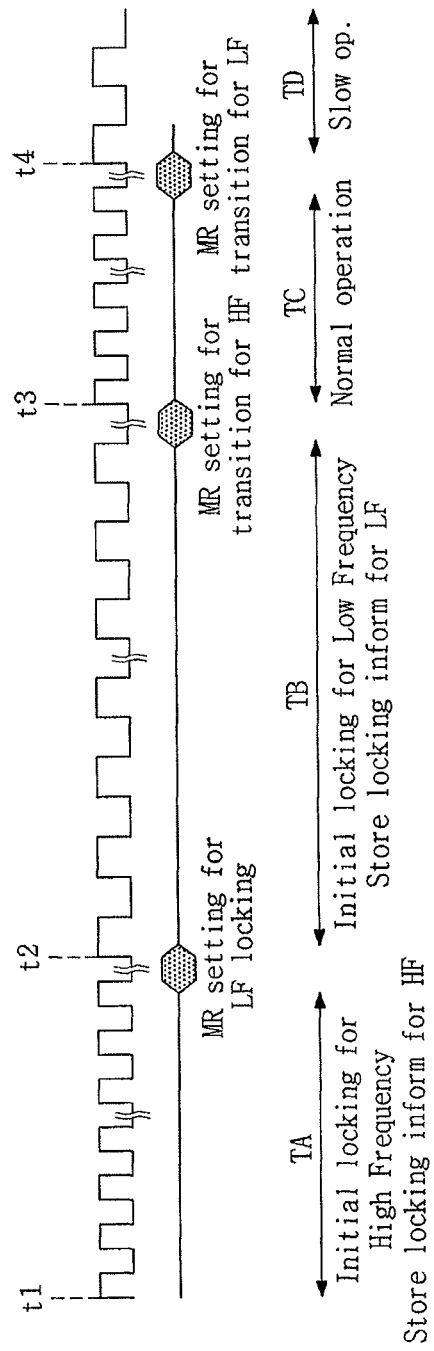
FIG. 2 illustrates a timing diagram of an exemplary operation of the DLL circuit shown in FIG. 1.

FIG. 2 illustrates a timing diagram of an exemplary operation of the DLL circuit 1000 shown in FIG. 1.

Figure 3:
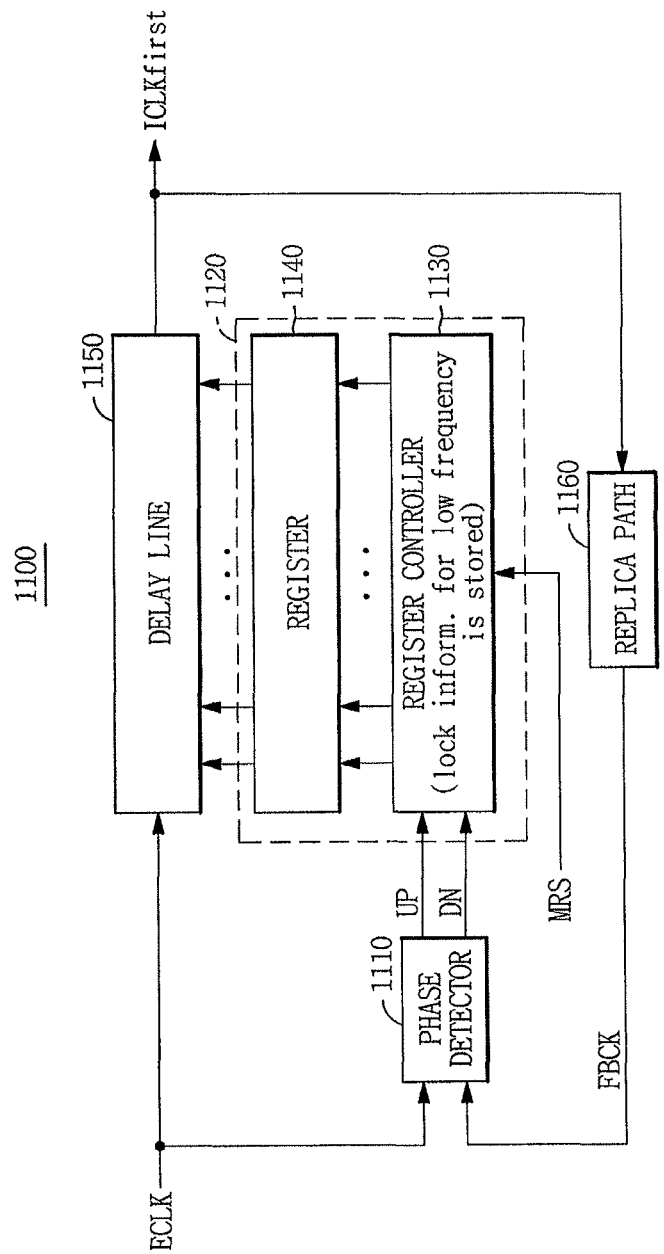
FIG. 3 illustrates a block diagram of an exemplary embodiment of the DLL for a clock signal having a low frequency employable in the DLL circuit shown in FIG. 1.

Referring to FIG. 2, the first DLL 1100 may perform locking with respect to the external clock signal ECLK and a feedback clock signal FBCK (see FIG. 3). The DLL 100 may store locking information during a time period TA between a time point t1 and a time point t2 when the external clock signal ECLK having a high frequency is received during an initial operation of a system. The first DLL 1100 may perform locking with respect to the external clock signal ECLK and a feedback clock signal FBCK and may store locking information during a time period TB between a time point t2 and a time point t3 in response to an MRS signal when the external clock signal ECLK having a low frequency is received during an initial operation of a system. That is, e.g., during an initial operation of a system, the first DLL 1100 may perform initial locking for a high frequency during the time period TA, and may perform initial locking for a low frequency during the time period TB.

The DLL circuit 1000 may perform locking with respect to the external clock signal ECLK and a feedback clock signal FBCK during a time period TC between a time point t3 and a time point t4 when the external clock signal ECLK having a high frequency is received. More particularly, e.g., during the time period TC, the DLL circuit 1000 may perform locking with respect to the external clock signal ECLK and a feedback clock signal FBCK using the locking information stored during the time period TA.

After the time point t4, the DLL circuit 1000 may perform locking with respect to the external clock signal ECLK and a feedback clock signal FBCK in response to an MRS signal when the external clock signal ECLK having a low frequency is received. After the time point t4, the DLL circuit 1000 may perform locking with respect to the external clock signal ECLK and a feedback clock signal FBCK using the locking information stored during the time period TB.

Embodiments may provide a DLL circuit, e.g., 1000, which may be included in a dynamic random access memory (DRAM), and may generate an internal clock signal having a high frequency during a normal operating mode, e.g., a read mode, a write mode, etc., and may generate an internal clock signal having a low frequency during, e.g., a standby mode or when the system is idle.

FIG. 3 illustrates a block diagram of an exemplary embodiment of the first DLL 1100 for a clock signal having a low frequency employable in the DLL circuit 1000 shown in FIG. 1. Referring to FIG. 3, the first DLL 1100 may include a phase detector 1110, a delay control circuit 1120, a delay line 1150, and a replica path 1160.

The phase detector 1110 may compare the external clock signal ECLK and a feedback signal FBCK, and may generate an up signal UP and a down signal DN.

The delay control circuit 1120 may store locking information for a clock signal having a low frequency, may generate delay control signals based on the up signal UP and the down signal DN, and may select a delay amount of the delay line 1150. The delay control circuit 1120 may operate in response to an MRS signal. For example, the delay control circuit 1120 may operate when the MRS signal is enabled, and may not operate when the MRS signal is disabled. The delay control circuit 1120 may operate when the external clock signal ECLK or the internal clock signal ICLK has a low frequency. The delay control circuit 1120 may not operate when the external clock signal ECLK or the internal clock signal ICLK has a high frequency.

The delay line 1150 may delay the external clock signal ECLK to generate the internal clock signal ICLK$_{first}$ in response to output signals of the delay control circuit 1120. The internal clock signal ICLK$_{first}$ output from the first DLL 1100 may be output as the internal clock signal ICLK output from the DLL circuit 1000. The replica path 1160 may be a path having a delay time corresponding to a transmission delay time from a location of a circuit in which the internal clock signal ICLK$_{first}$ is used to the phase detector 1110. The replica path 1160 may delay the internal clock signal ICLK$_{first}$ to generate the feedback clock signal FBCK.

The delay control circuit 1120 may include a register controller 1130 and a register 1140. The register controller 1130 may store locking information for a low frequency clock signal in response to the MRS signal. The register controller 1130 may generate register control signals based on the up signal UP and the down signal DN. The register 1140 may generate delay control signals based on the register control signals from the register controller 1130.

Figure 4:
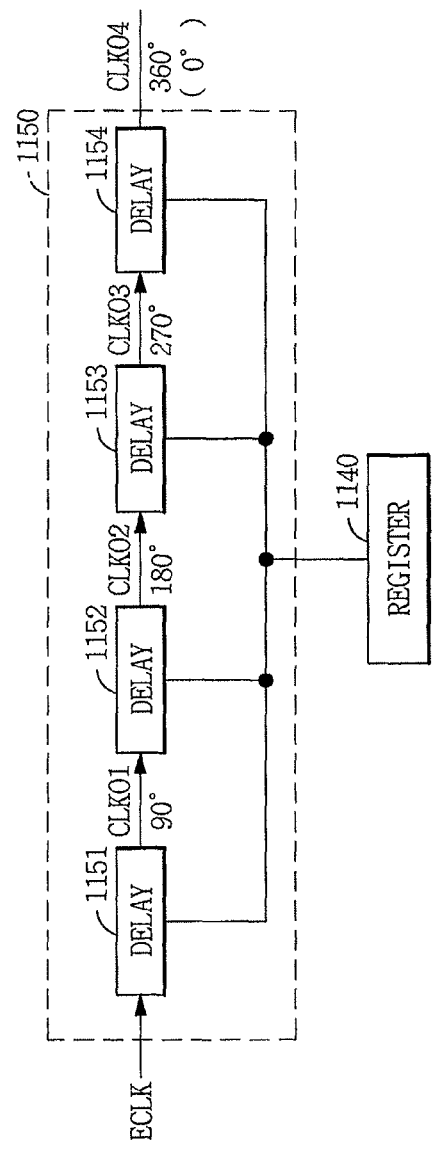
FIG. 4 illustrates a block diagram of an exemplary embodiment of the delay line employable in the DLL shown in FIG. 3.

FIG. 4 illustrates a block diagram of an exemplary embodiment of the delay line 1150 employable in the DLL shown in FIG. 3.

Referring to FIG. 4, the delay line 1150 may include a plurality of delay cells, e.g., four delay cells 1151 to 1154. Each of the delay cells 1151 to 1154 may have a predetermined delay time. Each of the delay cells 1151 to 1154 may delay an input signal by 90° and generate a respective output signal CLK01, CLK02, CLK03, CLK04. More particularly, each of the delay cells 1151 to 1154 may generate the respective output signal CLK01, CLK02, CLK03, CLK04 in response to delay control signals output from the register 1140. More particularly, the delay cell 1151 may delay a phase of the external clock signal ECLK by 90° to generate the first clock signal CLKO1. The delay cell 1152 may delay a phase of the first clock signal CLKO1 by 90° to generate the second clock signal CLKO2. The delay cell 1153 may delay a phase of the second clock signal CLKO2 by 90° to generate the third clock signal CLKO3. The delay cell 1153 delay a phase of the third clock signal CLKO3 by 90° to generate the fourth clock signal CLKO4.

Although FIG. 4 illustrates an embodiment of the delay line 1150 including four delay cells, embodiments are not limited thereto, e.g., the delay line 1150 may include an arbitrary number of delay cells. Further, although the delay line 1150 including delay cells having a delay amount of 90° is shown in FIG. 4, the delay line 1150 may include delay cells having an arbitrary delay amount.

Figure 5:
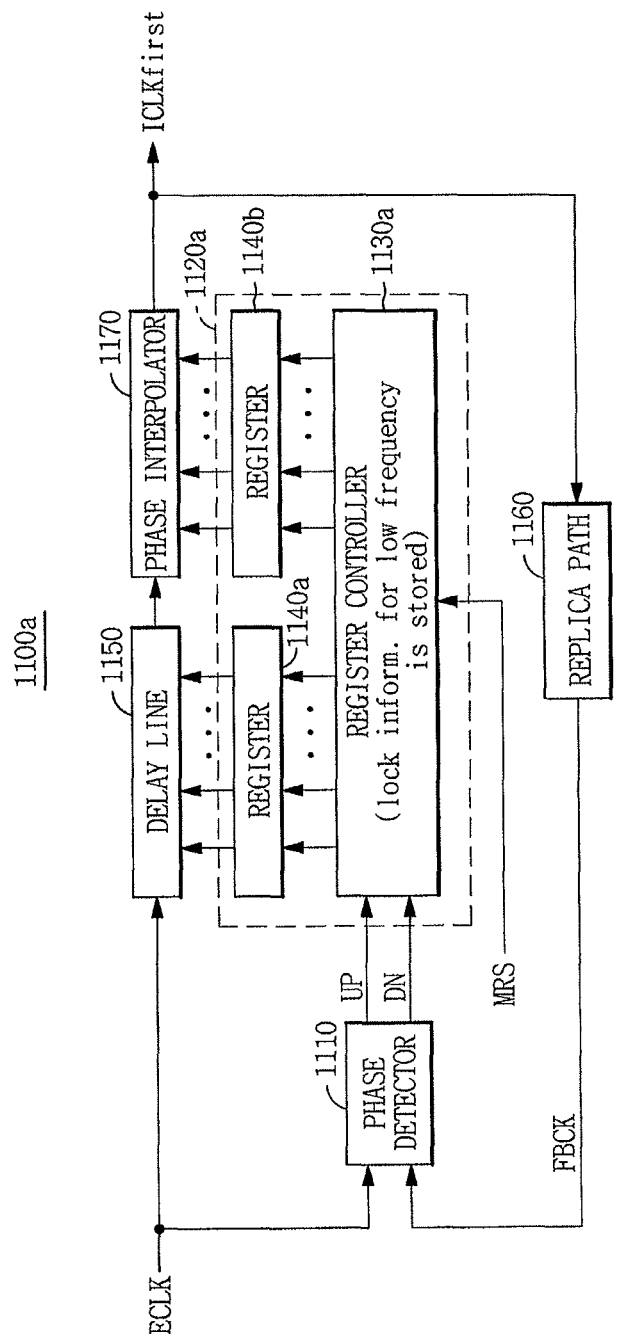
FIG. 5 illustrates a block diagram of another exemplary embodiment of the DLL for a clock signal having a low frequency employable in the DLL circuit shown in FIG. 1.

FIG. 5 illustrates a block diagram of another exemplary embodiment of a first DLL 1100a for a clock signal having a low frequency employable in the DLL circuit 1000 shown in FIG. 1. In general, only differences between the exemplary embodiment of the first DLL 1100a for a clock signal having a low frequency of FIG. 5 and the exemplary embodiment of the first DLL 1100 for a clock signal having a low frequency of FIG. 3 will be described below.

Referring to FIG. 5, the first DLL 1100a may include the phase detector 1110, a delay control circuit 1120a, the delay line 1150, the replica path 1160 and a phase interpolator 1170.

The delay control circuit 1120a may store locking information for a clock signal having the low frequency. The delay control circuit 1120a may generate delay control signals and interpolation control signals based on the up signal UP and the down signal DN. The delay control circuit 1120a may select a delay amount of the delay line 1150 and a delay amount of the phase interpolator 1170. The delay control circuit 1120a may operate in response to an MRS signal. For example, the delay control circuit 1120a may operate when the MRS signal is enabled, and may not operate when the MRS signal is disabled. The delay control circuit 1120a may operate when the external clock signal ECLK or the internal clock signal ICLK has a low frequency. The delay control circuit 1120a may not operate when the external clock signal ECLK or the internal clock signal ICLK has a high frequency.

The phase interpolator 1170 may delay an output signal of the delay line 1150 to generate the first internal clock signal $ICLK_{first}$ in response to the interpolation control signals that are output signals of the delay control circuit 1120a. The phase interpolator 1170 may output values between two of the output signals of the delay line 1150. More particularly, the phase interpolator 1170 may output the first internal clock signal $ICLK_{first}$ having a precise value. The internal clock signal $ICLK_{first}$ output from the phase interpolator 1170 may correspond to an output signal of the first DLL 1100a, and may be output as the internal clock signal ICLK output from the DLL circuit 1000.

The delay control circuit 1120a may include a register controller 1130a, a first register 1140a, and a second register 1140b. The register controller 1130a may store locking information for a low frequency clock signal in response to the MRS signal, and may generate register control signals based on the up signal UP and the down signal DN. The first register 1140a may generate the delay control signals based on the register control signals. The second register 1140b may generate the interpolation control signals based on the register control signals.

Figure 6:
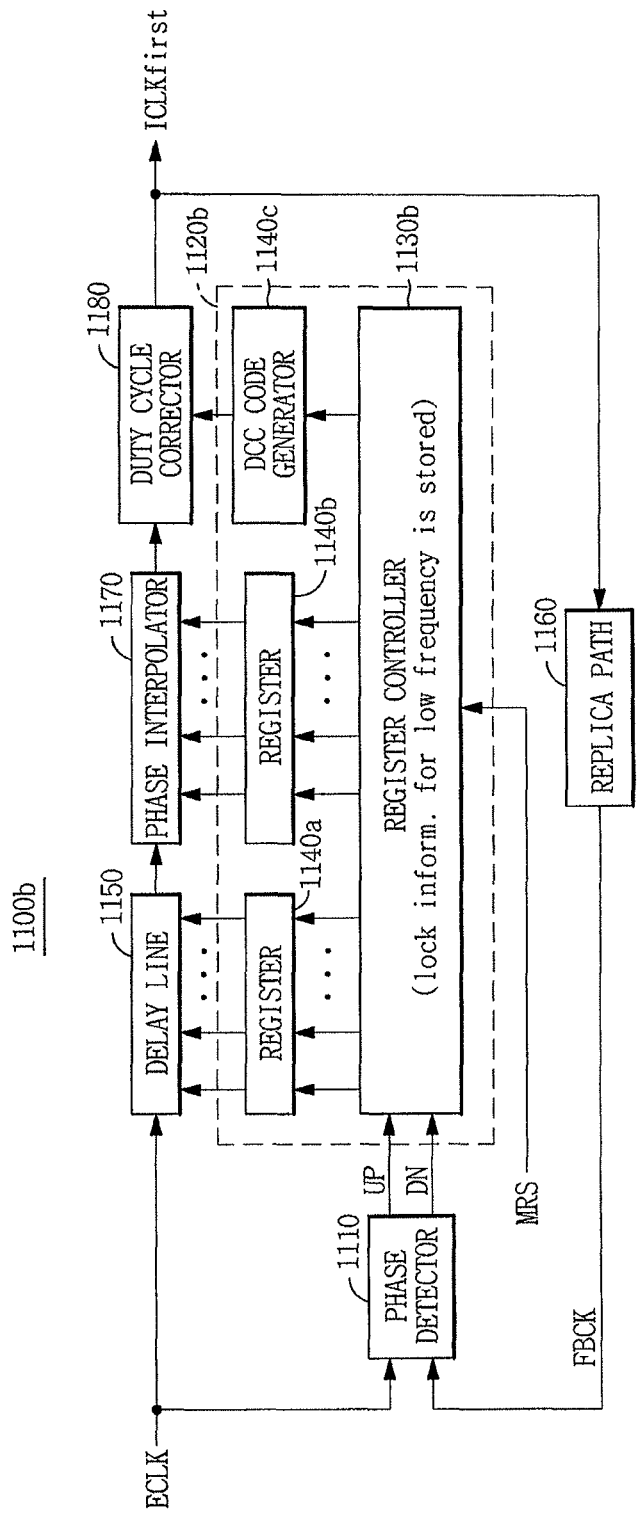
FIG. 6 illustrates a block diagram of another exemplary embodiment of the DLL for a clock signal having a low frequency employable in the DLL circuit shown in FIG. 1.

FIG. 6 illustrates a block diagram of another exemplary embodiment of a first DLL 1100b for a clock signal having a low frequency employable in the DLL circuit 1000 shown in FIG. 1. In general, only differences between the exemplary embodiment of the first DLL 1100b for a clock signal having a low frequency of FIG. 6 and the exemplary embodiment of the first DLL 1100a for a clock signal having a low frequency of FIG. 5 will be described below.

Referring to FIG. 6, the first DLL 1100b may include the phase detector 1110, a delay control circuit 1120b, the delay line 1150, the replica path 1160, the phase interpolator 1170, and a duty cycle corrector 1180.

The delay control circuit 1120b may store locking information for a clock signal having the low frequency. The delay control circuit 1120b may generate delay control signals, interpolation control signals, and a duty cycle correction code based on the up signal UP and the down signal DN. The delay control circuit 1120b may select a delay amount of the delay line 1150 and a delay amount of the phase interpolator 1170. The delay control circuit 1120b may control the duty cycle corrector 1180. The delay control circuit 1120b may operate in response to an MRS signal. For example, the delay control circuit 1120b may operate when the MRS signal is enabled, and may not operate when the MRS signal is disabled. The delay control circuit 1120b may operate when the external clock signal ECLK or the internal clock signal ICLK has a low frequency. The delay control circuit 1120b may not operate when the external clock signal ECLK or the internal clock signal ICLK has a high frequency.

The duty cycle corrector 1180 may generate the internal clock signal $ICLK_{first}$ in response to a duty cycle correction code. The internal clock signal $ICLK_{first}$ output from the duty cycle corrector 1180 may correspond to an output signal of the first DLL 1100a, and may be output as the internal clock signal ICLK output from the DLL circuit 1000. The phase interpolator 1170 may output values between two of the output signals of the delay line 1150 to the duty cycle corrector 1180.

The delay control circuit 1120b may include a register controller 1130b, a first register 1140a, a second register 1140b and a duty cycle correction code generator 1140c. The register controller 1130b may store locking information for a low frequency clock signal in response to the MRS signal, and may generate register control signals based on the up signal UP and the down signal DN. The first register 1140a may generate the delay control signals based on the register control signals. The second register 1140b may generate the interpolation control signals based on the register control signals. The duty cycle correction code generator 1140c may generate the duty cycle correction code based on the register control signals.

Figure 7:
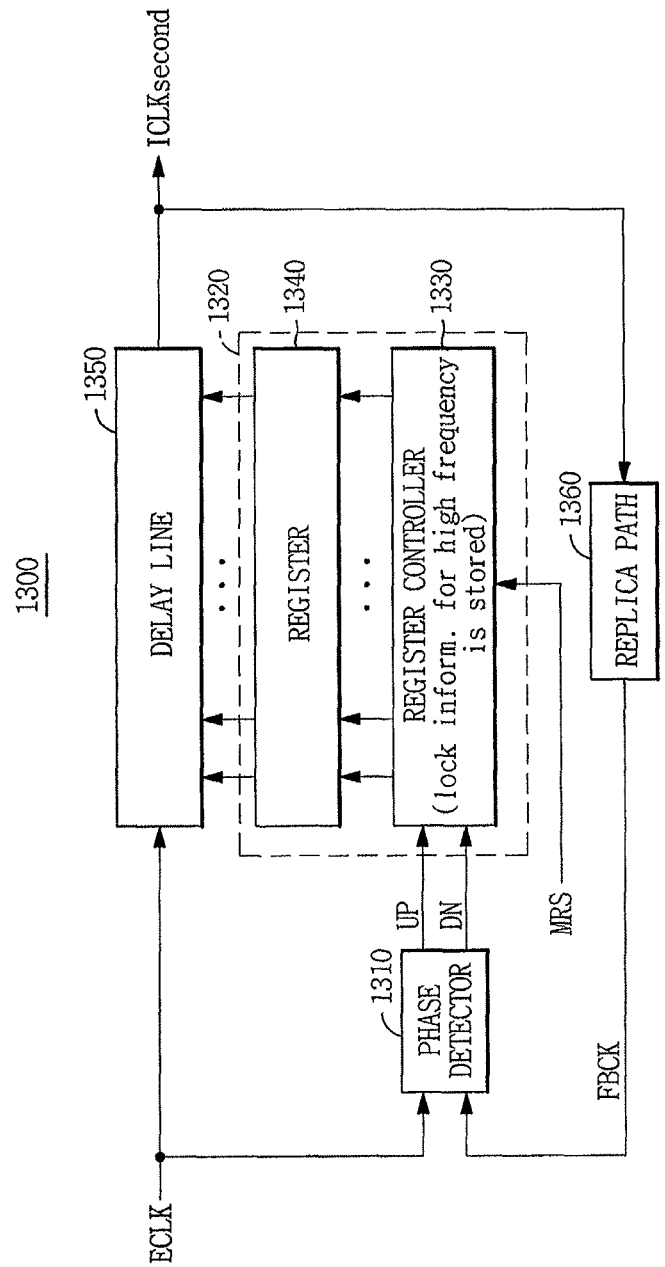
FIG. 7 illustrates a block diagram of an exemplary embodiment of the DLL for a clock signal having a high frequency employable in the DLL circuit shown in FIG. 1.

FIG. 7 illustrates a block diagram of an exemplary embodiment of the second DLL 1300 for a clock signal having a high frequency employable in the DLL circuit 1000 shown in FIG. 1.

Referring to FIG. 7, the second DLL 1300 may include a phase detector 1310, a delay control circuit 1320, a delay line 1350 and a replica path 1360.

The phase detector 1310 may compare the external clock signal ECLK and a feedback signal FBCK to generate an up signal UP and a down signal DN. The delay control circuit 1320 may store locking information for a clock signal having a high frequency. The delay control circuit 1320 may generate delay control signals based on the up signal UP and the down signal DN. The delay control circuit 1320 may select a delay amount of the delay line 1350. The delay control circuit 1320 may operate in response to an MRS signal. For example, the delay control circuit 1320 may operate when the MRS signal is enabled, and may not operate when the MRS signal is disabled. The delay control circuit 1320 may operate when the external clock signal ECLK or the internal clock signal ICLK has a high frequency. The delay control circuit 1320 may not operate when the external clock signal ECLK or the internal clock signal ICLK has a low frequency.

The delay line 1350 may delay the external clock signal ECLK to generate a second internal clock signal $ICLK_{second}$ as the internal clock signal ICLK in response to output signals of the delay control circuit 1320. That is, the second internal clock signal $ICLK_{second}$ may correspond to an output signal of the second DLL 1300, and may be selected and may be output as the internal clock signal ICLK output from the DLL circuit 1000. The replica path 1360 may be a path having a delay time corresponding to a transmission delay time from a location of a circuit in which the internal clock signal $ICLK_{second}$ is used to the phase detector 1310. The replica path 1360 may delay the second internal clock signal $ICLK_{second}$ to generate the feedback clock signal FBCK.

The delay control circuit 1320 may include a register controller 1330 and a register 1340. The register controller 1330 may store locking information for a high frequency clock signal in response to the MRS signal. The register controller 1330 may generate register control signals based on the up signal UP and the down signal DN. The register 1340 may generate delay control signals based on the register control signals.

Embodiments of the second DLL 1300 are not limited to that illustrated in FIG. 7. For example, embodiments of a second DLL may employ one or more features described in relation to the exemplary embodiments of the first DLL 1100a, 1100b.

Figure 8:
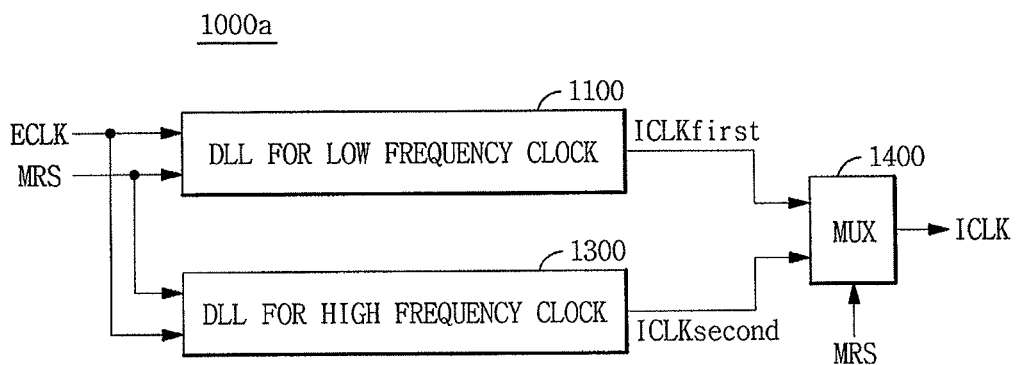
FIG. 8 illustrates a block diagram of another exemplary embodiment of a DLL circuit.

FIG. 8 illustrates a block diagram of a DLL circuit 1000a according to another exemplary embodiment. Referring to FIG. 8, the DLL circuit 1000a may include the first DLL 1100, the second DLL 1300 and a multiplexer 1400. In general, only differences between the exemplary DLL circuit 1000a of FIG. 8 and the exemplary DLL circuit 1000 of FIG. 1 will be described.

Referring to FIG. 8, the DLL circuit 1000a includes the multiplexer 1400. The first DLL 1100 adjusts a delay time of an external clock signal ECLK to generate a first internal clock signal $ICLK_{first}$ synchronized with the external clock signal ECLK when the external clock signal ECLK has a low frequency. The second DLL 1300 may adjust the delay time of the external clock signal ECLK to generate a second internal clock signal $ICLK_{second}$ synchronized with the external clock signal ECLK when the external clock signal ECLK has a high frequency. The multiplexer 1400 may select one of the first internal clock signal $ICLK_{first}$ and the second internal clock signal $ICLK_{second}$ to generate an internal clock signal ICLK in response to an MRS signal.

Figure 9:
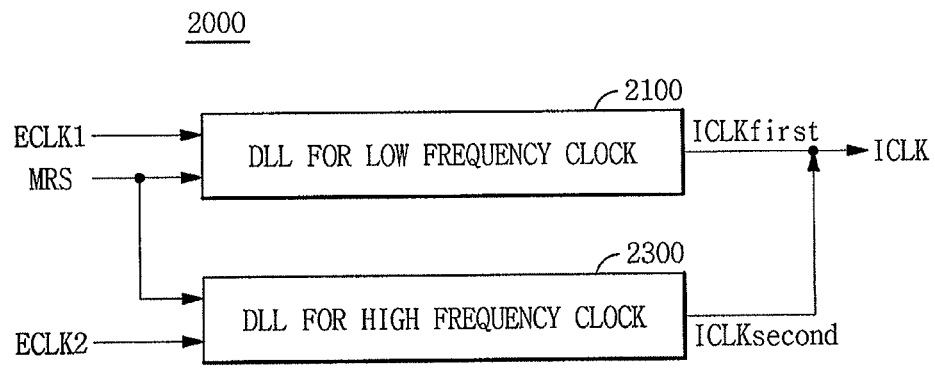
FIG. 9 illustrates a block diagram of another exemplary embodiment of a DLL circuit.

FIG. 9 illustrates a block diagram of a DLL circuit 2000 according to another exemplary embodiment. Referring to FIG. 9, the DLL circuit 2000 includes a first DLL 2100 and a second DLL 2300. In general, only differences between the exemplary DLL circuit 2000 of FIG. 9 and the exemplary DLL circuit 1000 of FIG. 1 will be described.

The first DLL 2100 may adjust a delay time of a first external clock signal ECLK1 having a low frequency received from a first input terminal to generate a first internal clock $ICLK_{first}$ signal synchronized with the first external clock signal ECLK1. The second DLL 2300 may adjust a delay time of a second external $ICLK_{second}$ clock signal ECLK2 having a high frequency received from a second input terminal to generate a second internal clock signal $ICLK_{second}$ synchronized with the second external clock signal ECLK2. The DLL circuit 2000 may output the first internal clock signal $ICLK_{first}$ or the second internal clock signal $ICLK_{second}$ as an internal clock signal ICLK in response to an MRS signal.

Figure 10:
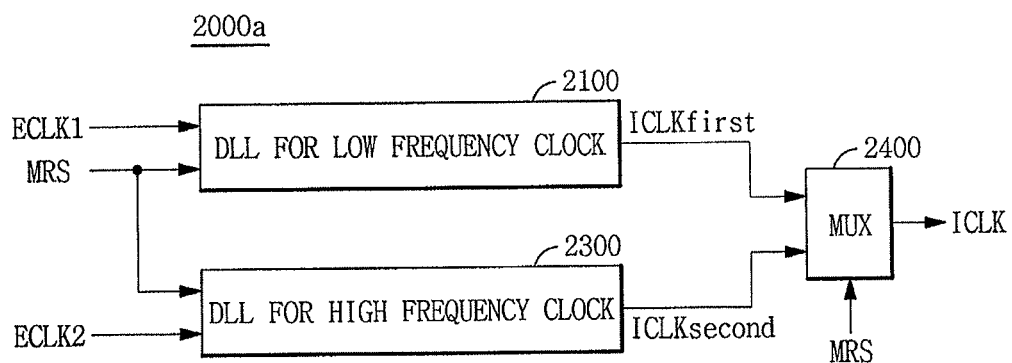
FIG. 10 illustrates a block diagram of another exemplary embodiment of a DLL circuit.

FIG. 10 illustrates a block diagram of a DLL circuit 2000a according to another exemplary embodiment. In general, only differences between the exemplary DLL circuit 2000a of FIG. 10 and the exemplary DLL circuit 2000 of FIG. 9 will be described.

Referring to FIG. 10, the DLL circuit 2000a may include the first DLL 2100, the second DLL 2300, and a multiplexer 2400.

Referring to FIG. 10, the DLL circuit 2000a includes the multiplexer 2400. The first DLL 2100 may adjust a delay time of a first external clock signal ECLK1 having a low frequency received from a first input terminal to generate a first internal clock signal $ICLK_{first}$ synchronized with the first external clock signal ECLK1. The second DLL 2300 may adjust a delay time of a second external clock signal ECLK2 having a high frequency received from a second input terminal to generate a second internal clock signal $ICLK_{second}$ synchronized with the second external clock signal ECLK2. The multiplexer 2400 may select one of the first internal clock signal $ICLK_{first}$ and the second internal clock signal $ICLK_{second}$ to generate an internal clock signal ICLK in response to an MRS signal.

Figure 11:
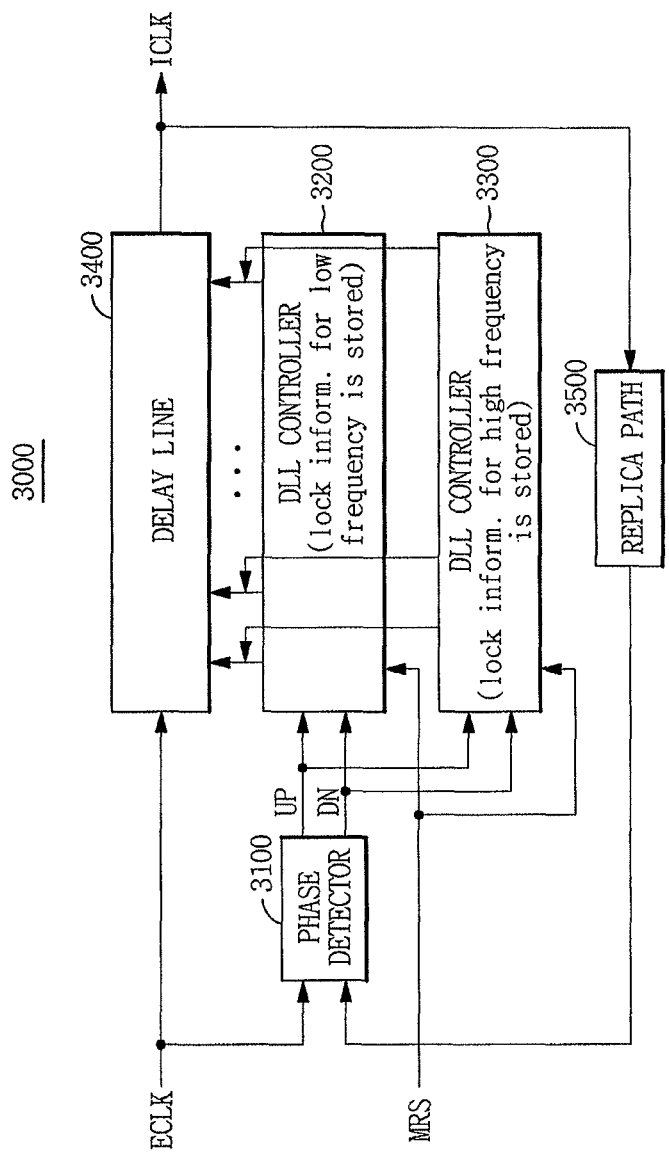
FIG. 11 illustrates a block diagram of another exemplary embodiment of a DLL circuit.

FIG. 11 illustrates a block diagram of a DLL circuit 3000 according to another exemplary embodiment. Referring to FIG. 11, the DLL circuit 3000 may include a phase detector 3100, a first delay control circuit 3200, a second delay control circuit 3300, a delay line 3400, and a replica path 3500.

The phase detector 3100 may compare an external clock signal ECLK and a feedback signal FBCK, and may generate an up signal UP and a down signal DN. The first delay control circuit 3200 may store locking information for a clock signal having a low frequency. The first delay control circuit 3200 may generate first delay control signals based on the up signal UP and the down signal DN. The first delay control circuit 3200 may select a delay amount of the delay line 3400. The second delay control circuit 3300 may store locking information for a clock signal having a high frequency, and generates second delay control signals based on the up signal UP and the down signal DN. The second delay control circuit 3300 may select a delay amount of the delay line 3400.

The first delay control circuit 3200 and the second delay control circuit 3300 may operate in response to an MRS signal. For example, the first delay control circuit 3200 may operate when the MRS signal is enabled, and not operate when the MRS signal is disabled. The second delay control circuit 3300 may operate when the MRS signal is disabled, and may not operate when the MRS signal is enabled. The first delay control circuit 3200 may operate when the external clock signal ECLK or the internal clock signal ICLK has a low frequency, and the second delay control circuit 3300 may operate when the external clock signal ECLK or the internal clock signal ICLK has a high frequency.

The delay line 3400 may delay the external clock signal ECLK to generate the internal clock signal ICLK in response to output signals of the first delay control circuit 3200 and the second delay control circuit 3300. The replica path 3500 may be a path having a delay time corresponding to a transmission delay time from a location of a circuit in which the internal clock signal ICLK is used to the phase detector 3100. The replica path 3500 may delay the internal clock signal ICLK to generate the feedback clock signal FBCK.

Figure 12:
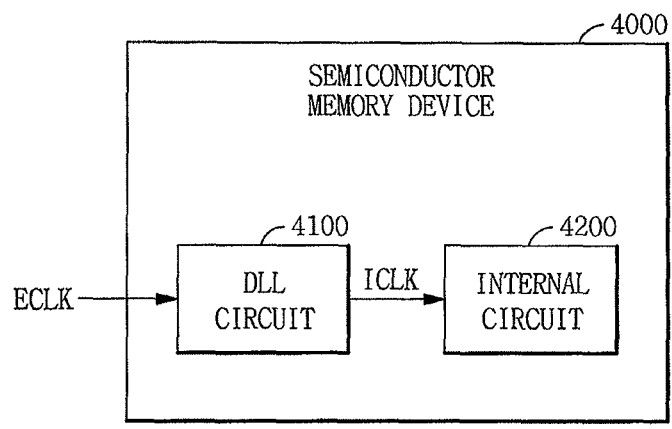
FIG. 12 illustrates a block diagram of a semiconductor memory device including a DLL circuit employing one or more features described herein.

FIG. 12 illustrates a block diagram of a semiconductor memory device 4000 including a DLL circuit employing one or more features described herein, e.g., 1000, 1000, 1000a, 2000, 2000a, 3000.

Referring to FIG. 12, the semiconductor memory device 4000 may include a DLL circuit 4100 and an internal circuit 4200. The DLL circuit 4100 may generate an internal clock signal ICLK synchronized with an external clock signal ECLK, and the internal circuit 4200 may operate in response to the internal clock signal ICLK. For example, the internal circuit 4200 may be an output circuit of a DRAM device. In a read mode, the DRAM device may sample and output data in response to the internal clock signal ICLK.

The DLL circuit 4100 may employ one or more features described herein and/or may correspond to one of the exemplary DLL circuits described above, e.g., 1000, 1000, 1000a, 2000, 2000a, 3000. For example, the DLL circuit 4100 may be the DLL circuit 1000 having the exemplary circuit structure shown in FIG. 1. That is, the DLL circuit 4100 may include the first DLL 1100, which may operate when an external clock signal has a low frequency, and the second DLL 1300, which may operate when the external clock signal has a high frequency.

More particularly, although not shown in FIG. 12, referring, e.g., to FIG. 1, the DLL circuit 4100 may include a first DLL that operates when an external clock signal has a low frequency and a second DLL that operates when the external clock signal has a high frequency. In such embodiments, the first DLL may store locking information of a first internal clock signal $ICLK_{first}$ having a low frequency. The second DLL may store locking information of a second internal clock signal $ICLK_{second}$ having a high frequency. The DLL circuit 4100 may generate an internal clock signal synchronized with the external clock signal using the locking information of the first internal clock signal $ICLK_{first}$ and the second internal clock signal $ICLK_{second}$ during a subsequent operation.

Figure 13:
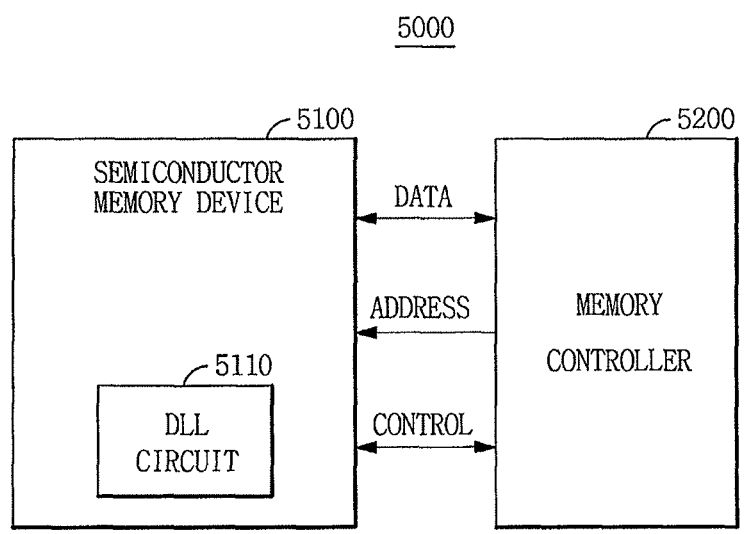
FIG. 13 illustrates a block diagram of a memory system including the DLL circuit employing one or more features described herein.

FIG. 13 illustrates a block diagram of an exemplary embodiment of a memory system 5000 including a DLL circuit employing one or more features described herein, e.g., 1000, 1000, 1000a, 2000, 2000a, 3000.

Referring to FIG. 13, the memory system 5000 may include a semiconductor memory device 5100 and a memory controller 5200. The semiconductor memory device 5100 may receive an address from the memory controller 5200 and may transmit or receives data and a control signal.

The semiconductor memory device 5100 includes a DLL circuit 5110. The DLL circuit 5110 may employ one or more features described herein and/or may correspond to one of the exemplary DLL circuits described above, e.g., 1000, 1000, 1000a, 2000, 2000a, 3000. For example, the DLL circuit 5110 may be the DLL circuit 1000 having the circuit structure shown in FIG. 1. That is, e.g., the DLL circuit 5110 may include the first DLL 1100 and the second DLL 1300.

In the above, the DLL circuit and the semiconductor memory device having the DLL circuit are mainly described, but embodiments of the inventive concept may be applied to a general semiconductor device such as a system on chip (SOC).

Embodiments may provide a DLL circuit including a DLL that operates when an external clock signal has a low frequency and a DLL that operates when the external clock signal has a high frequency. The DLL circuit may store beforehand locking information of an external clock signal having a low frequency and locking information of an external clock signal having a high frequency, and may generate an internal clock signal synchronized with the external clock signal using the locking information during a subsequent operation. In embodiments of the DLL circuit, a time required to synchronize the internal clock signal with the external clock signal may be relatively short when the external clock signal changes from low frequency to high frequency or from high frequency to low frequency. Embodiments may enable a semiconductor device and a system including the DLL circuit to operate at a relatively high speed relative to comparable conventional devices.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A memory system, comprising:
   a memory controller; and
   a semiconductor memory device configured to transmit data to or receive data from the memory controller,
   wherein the semiconductor memory device comprises:
   a first delay-locked-loop (DLL) configured to adjust a delay time of an external clock signal to generate a first internal clock signal synchronized with the external clock signal when the external clock signal has a first frequency; and
   a second DLL configured to adjust the delay time of the external clock signal to generate a second internal clock signal synchronized with the external clock signal when the external clock signal has a second frequency,
   wherein the second DLL is configured to operate in response to a mode register set signal.

2. The memory system as claimed in claim 1, wherein the first frequency is a low frequency and the second frequency is a high frequency.

3. The memory system as claimed in claim 1, wherein the first DLL is configured to operate in response to the mode register set signal.

* * * * *